(12) United States Patent
Kim et al.

(10) Patent No.: US 11,636,786 B2
(45) Date of Patent: Apr. 25, 2023

(54) DISPLAY DEVICE

(71) Applicant: Samsung Display Co., LTD., Yongin-si (KR)

(72) Inventors: Hongam Kim, Seoul (KR); Youngmin Cho, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 131 days.

(21) Appl. No.: 17/166,431

(22) Filed: Feb. 3, 2021

(65) Prior Publication Data

US 2021/0383730 A1 Dec. 9, 2021

(30) Foreign Application Priority Data

Jun. 3, 2020 (KR) .................. 10-2020-0067133

(51) Int. Cl.
| | | |
|---|---|---|
| *G06F 1/16* | (2006.01) | |
| *G09F 9/30* | (2006.01) | |
| *G09G 3/3225* | (2016.01) | |
| *H01L 27/32* | (2006.01) | |

(52) U.S. Cl.
CPC ............ *G09F 9/301* (2013.01); *G06F 1/1616* (2013.01); *G06F 1/1626* (2013.01); *G09G 3/3225* (2013.01); *H01L 27/3276* (2013.01)

(58) Field of Classification Search
CPC ...... G09F 9/301; G06F 1/1616; G06F 1/1626; G06F 1/1637; G06F 1/1641; G06F 1/1652; G09G 3/3225; G09G 2300/0426; G09G 3/035; G09G 3/3275; H01L 27/3276; H01L 27/3223; H01L 2251/5338; H01L 27/3255; H01L 23/544; H01L 24/81
See application file for complete search history.

(56) References Cited

U.S. PATENT DOCUMENTS

| | | | |
|---|---|---|---|
| 9,591,754 B2 | 3/2017 | Lee | |
| 9,831,432 B2 | 11/2017 | Im | |
| 10,304,776 B2* | 5/2019 | Kim | .............. H01L 51/0097 |
| 10,739,892 B2* | 8/2020 | Shim | .............. G02F 1/13458 |
| 10,997,881 B2* | 5/2021 | Shin | .............. H01L 51/0097 |
| 11,049,423 B1* | 6/2021 | Wang | .............. G06F 1/1652 |
| 11,287,556 B2* | 3/2022 | Zhang | .............. G02F 1/136 |
| 2014/0368228 A1* | 12/2014 | Kim | .............. H01L 51/0097 |
| | | | 324/750.3 |
| 2016/0218289 A1 | 7/2016 | Lee et al. | |
| 2016/0270209 A1* | 9/2016 | Cho | .............. G06F 1/1652 |
| 2017/0346041 A1* | 11/2017 | Kim | .............. H01L 51/5256 |
| 2018/0061748 A1* | 3/2018 | Kim | .............. H01L 24/81 |
| 2018/0164619 A1* | 6/2018 | Kim | .............. G02F 1/133308 |

(Continued)

FOREIGN PATENT DOCUMENTS

| | | |
|---|---|---|
| KR | 10-2016-0091526 | 8/2016 |
| KR | 10-2017-0039813 | 4/2017 |

(Continued)

*Primary Examiner* — Rockshana D Chowdhury
(74) *Attorney, Agent, or Firm* — Kile Park Reed & Houtteman PLLC

(57) ABSTRACT

A display device includes a display panel including a display area and a non-display area adjacent to the display area, and a driving circuit disposed on the non-display area. The driving circuit includes a plurality of bumps disposed in a plurality of rows, and a first alignment mark bump disposed at an end of at least one of the plurality of rows.

20 Claims, 9 Drawing Sheets

(56) References Cited

U.S. PATENT DOCUMENTS

| | | | | |
|---|---|---|---|---|
| 2018/0173277 A1* | 6/2018 | Lee | ................... | H01L 27/3276 |
| 2018/0336808 A1* | 11/2018 | Lee | ...................... | G09G 3/20 |
| 2019/0019441 A1* | 1/2019 | Shin | ................... | G09G 3/3233 |
| 2019/0157312 A1* | 5/2019 | Lee | ................... | H01L 27/3276 |
| 2019/0165078 A1* | 5/2019 | Tsuruoka | ............ | H01L 27/3276 |
| 2019/0229174 A1* | 7/2019 | Choi | ................ | H01L 27/3223 |
| 2019/0326274 A1 | 10/2019 | Lee et al. | | |
| 2020/0211437 A1* | 7/2020 | Ahn | ..................... | G09G 3/035 |
| 2021/0066238 A1* | 3/2021 | Iwai | ..................... | H01L 21/78 |
| 2021/0142698 A1* | 5/2021 | Oh | ..................... | G09F 9/301 |
| 2021/0157426 A1* | 5/2021 | Sung | ..................... | G06F 3/0412 |
| 2021/0201736 A1* | 7/2021 | You | ..................... | G09G 3/20 |
| 2021/0202887 A1* | 7/2021 | Han | ................... | H01L 51/5293 |
| 2021/0383730 A1* | 12/2021 | Kim | ..................... | G09G 3/3225 |
| 2022/0005915 A1* | 1/2022 | Kim | ................... | H01L 27/3223 |
| 2022/0108933 A1* | 4/2022 | Hwang | ................. | H01L 27/322 |

FOREIGN PATENT DOCUMENTS

| | | |
|---|---|---|
| KR | 10-1885717 | 8/2018 |
| KR | 10-2019-0122920 | 10/2019 |

* cited by examiner

DISPLAY DEVICE

CROSS-REFERENCE TO RELATED APPLICATION(S)

This application claims priority to and benefits of Korean Patent Application No. 10-2020-0067133 under 35 U.S.C. § 119, filed on Jun. 3, 2020, the entire contents of which are incorporated herein by reference.

BACKGROUND

1. Technical Field

The disclosure herein relates to a display device, and, to a display device that prevents a display panel from being damaged in a bonding process between the display panel and a driving circuit and thus improved durability and reliability.

2. Description of the Related Art

Display devices such as televisions, monitors, smart phones, and tablets that provide images to a user may include display panels that may display images. Various display panels such as liquid crystal display panels, organic light emitting display panels, electro wetting display panels, and electrophoretic display panels are being developed as display panels.

Recently, with the development of display devices, a display device including a flexible display panel has been developed. The display panel may include pixels displaying an image and a driving chip for driving the pixels. The pixels may be disposed on a display area of the display panel, and the driving chip may be disposed on a non-display area of the display panel, which may surround the display area. A bending part may be defined between the driving chip and the display area, and the bending part may be bent so that the driving chip may be disposed under or below the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device having improved reliability and durability.

The disclosure also provides a display device including a flexible base layer to prevent a display panel from being damaged in a bonding process between a driving circuit and the display panel, thereby improving durability and reliability.

An embodiment provides a display device that may include a display panel including a display area and a non-display area adjacent to the display area; and a driving circuit disposed on the non-display area, wherein the driving circuit may include a plurality of bumps disposed in a plurality of rows; and a first alignment mark bump disposed at an end of at least one of the plurality of rows.

In an embodiment, the plurality of bumps may include a plurality of first bumps disposed in a first row among the plurality of rows, the first row being adjacent to the display area, and the first alignment mark bump may be disposed in the first row.

In an embodiment, the plurality of first bumps may include a plurality of second bumps disposed at a left side with respect to a first reference bump; and a plurality of third bumps disposed on a right side with respect to the first reference bump, the plurality of second bumps may form an acute angle with respect to a reference line in a clockwise direction from the reference line to the plurality of second bumps, the reference line being at a center of the driving circuit in a direction intersecting a direction of the plurality of rows of the driving circuit, and the plurality of third bumps may form an acute angle with respect to the reference line in a counterclockwise direction from the reference line to the plurality of third bumps.

In an embodiment, the first alignment mark bump may have a thickness substantially same as a thickness of each of the plurality of first bumps.

In an embodiment, the plurality of bumps may further include dummy bumps disposed between the plurality of first bumps and the first alignment mark bump in the first row.

In an embodiment, the plurality of bumps may further include a plurality of second bumps disposed in a second row that may be spaced apart from the display area with the first row therebetween.

In an embodiment, the plurality of first bumps disposed in the first row may include an output bump that outputs a driving signal that drives a light emitting element disposed in the display panel.

In an embodiment, the first row in which the plurality of first bumps are disposed may be arranged at an end of the driving circuit, and the plurality of bumps may include a plurality of input bumps disposed in an input row arranged at another end facing the end of the driving circuit.

In an embodiment, the driving circuit may further include a second alignment mark bump disposed at an end of the input row.

In an embodiment, the display panel may include a plurality of pads corresponding to the plurality of bumps; and a panel alignment mark bump corresponding to the first alignment mark bump.

In an embodiment, a thickness of the first alignment mark bump may be in a range of about 8 μm to about 10 μm.

In an embodiment, the driving circuit may further include an alignment inspection mark bump that overlaps the first alignment mark bump in a column direction, and the alignment inspection mark bump may have a thickness substantially same as a thickness of the first alignment mark bump.

In an embodiment, the display panel may include a first non-folding area, a folding area, and a second non-folding area, and the folding area may fold with respect to a folding axis.

In an embodiment, the driving circuit may further include a driving chip in which the plurality of bumps and the first alignment mark bump may be disposed, and the first alignment mark bump may be disposed adjacent to an end of the driving chip.

In an embodiment, the display device may further include an anisotropic conductive film disposed between the driving circuit and the display panel.

In an embodiment, the plurality of bumps and the first alignment mark bump may include a same material.

In an embodiment, the driving circuit may further include a corner bump disposed at each of corners of the driving circuit, and the corner bump may have a thickness substantially same as a thickness of the first alignment mark bump.

In an embodiment, the driving circuit may have long sides extending in a direction parallel to the direction of the plurality of rows and short sides extending in a direction intersecting the direction of the plurality of rows, and the driving circuit may further include a long side bump disposed adjacent to at least one of the long sides of the driving circuit.

In an embodiment, the long side bump may have a thickness substantially same as a thickness of the first alignment mark bump.

In an embodiment, the driving circuit may further include edge bumps disposed adjacent to the long sides of the driving circuit and the short sides of the driving circuit, and each of the edge bumps may have a thickness substantially same as a thickness of the first alignment mark bump.

In an embodiment, a display device may include a display panel including a display area and a non-display area adjacent to the display area; and a driving circuit disposed on the non-display area, wherein the driving circuit may include a plurality of first bumps disposed in a first row; a plurality of second bumps disposed in a second row; and an alignment mark bump disposed at an end of at least one of the first row or the second row.

In an embodiment, the plurality of first bumps, the plurality of second bumps, and the alignment mark bump may have a substantially same thickness.

BRIEF DESCRIPTION OF THE DRAWINGS

The accompanying drawings are included to provide a further understanding, and are incorporated in and constitute a part of this specification. The drawings illustrate embodiments and, together with the description, serve to explain principles of the disclosure.
In the Drawings.

DETAILED DESCRIPTION OF THE EMBODIMENTS

Figure 1:
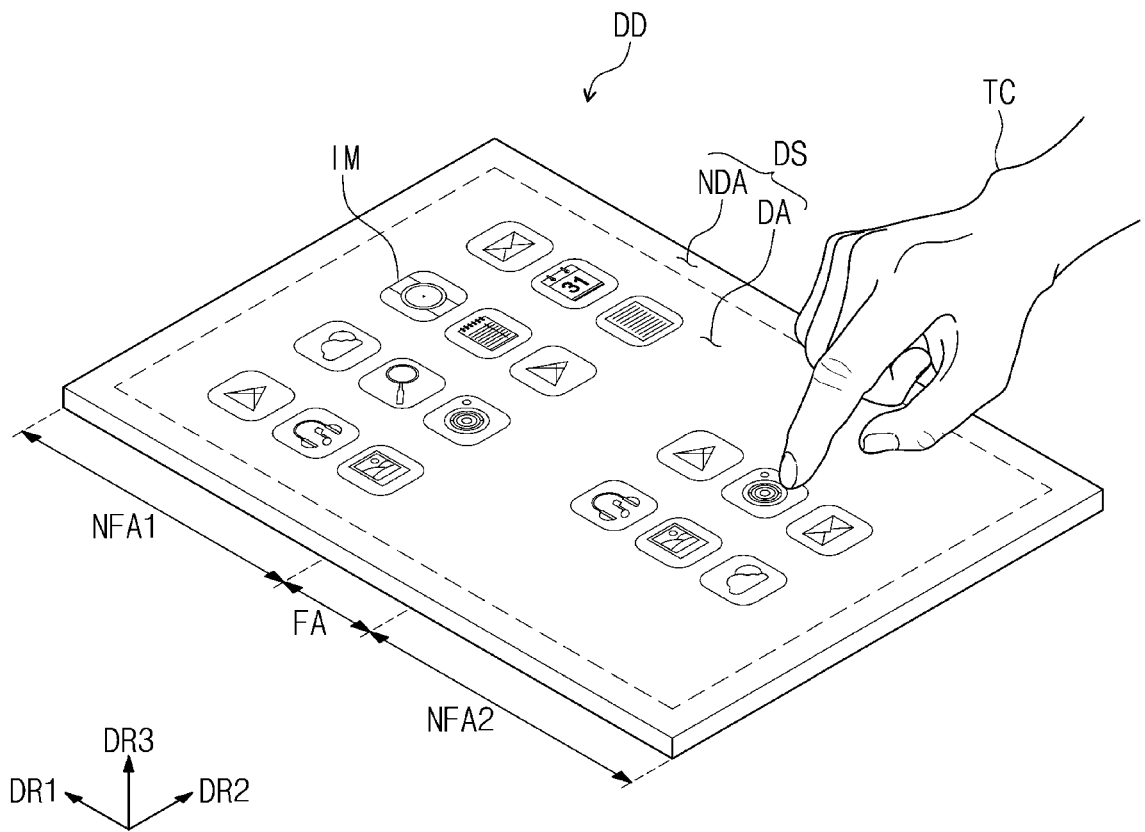
FIG. 1 is a perspective view of a display device according to an embodiment.

Hereinafter, embodiments will be described with reference to the accompanying drawings. In this specification, it will also be understood that when one component (or region, layer, portion, etc.) is referred to as being 'on', 'connected to', or 'coupled to' another component, it can be directly connected/coupled on/to the one component, or an intervening third component may also be present.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Like reference numerals refer to like elements throughout. Also, in the figures, the thickness, ratio, and dimensions of components are exaggerated for clarity of illustration.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

The meaning of "include" or "comprise" or "have" and their variations specifies a property, a fixed number, a step, an operation, an element, a component or a combination thereof, but does not exclude other properties, fixed numbers, steps, operations, elements, components or combinations thereof.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, a display device, a display panel provided in the display device, and a method for manufacturing the display panel according to an embodiment will be described.

Figure 2:
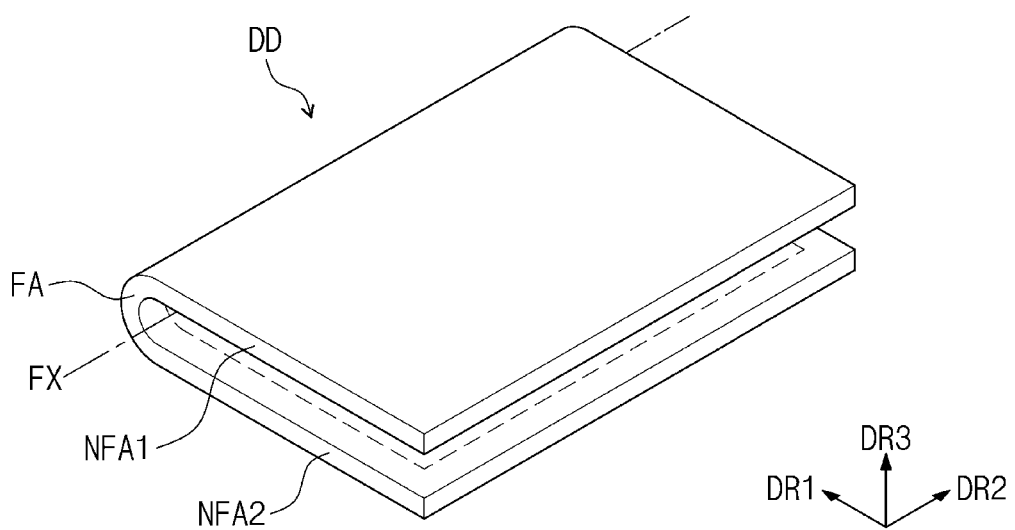
FIG. 2 is a view illustrating a folded state of the display device according to an embodiment.

FIG. 1 is a perspective view of a display device according to an embodiment. FIG. 2 is a view illustrating a folded state of the display device of FIG. 1.

Referring to FIG. 1, a display device DD according to an embodiment may have a substantially rectangular shape with long sides in a first direction DR1 and short sides in a second direction DR2 crossing or intersecting the first direction DR1. However, an embodiment is not limited thereto. For example, the display device DD may have various shapes such as a substantially circular shape, a substantially polygonal shape, and the like within the spirit and the scope of the disclosure. The display device DD may be a flexible display device.

Hereinafter, a direction that substantially perpendicularly crosses or intersects a plane defined by the first direction DR1 and the second direction DR2 is defined as a third direction DR3. Also, in this specification, the term "viewed on a plane" may be defined as a state when viewed in the third direction DR3.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged or disposed in the first direction DR1.

For example, although one folding area FA and two non-folding areas NFA1 and NFA2 are illustrated, an embodiment is not limited thereto. For example, the number of folding areas FA and the number of non-folding areas NFA1 and NFA2 are not limited thereto. For example, the display device DD may include a plurality of non-folding areas that may be more than two non-folding areas and a plurality of folding areas disposed between the non-folding areas.

A top surface of the display device DD may be defined as a display surface DS and may have a plane defined by the first direction DR1 and the second direction DR2. Images IM generated from the display device DD may be provided to a user through the display surface DS.

The display surface DS may include a display area DA and a non-display area NDA around or adjacent to the display area DA. An image may be displayed on the display area DA, but may not be displayed on the non-display area NDA. The non-display area NDA may surround or may be adjacent to the display area DA and define an edge of the display device DD, which may be printed with a predetermined color.

The display device DD may sense an external input TC applied from the outside. The external input TC may include various types of inputs provided from the outside of the display device DD. The external input TC applied from the outside may be provided in various forms.

For example, the external input TC may include an external input (for example, hovering) applied to be in proximity to the display device DD or adjacent by a predetermined distance to the display device DD as well as in contact with a portion of the human body such as a user's hands. Also, the input may be provided in various forms such as force, a pressure, light, and the like and is not limited to any one embodiment. FIG. 1 illustrates the user's hand as an example of the external input TC.

Referring to FIG. 2, the display device DD may be a folding-type (foldable) display device DD that may be capable of being folded or unfolded. For example, the folding area FA may be bent with respect to a folding axis FX parallel to the second direction DR2, and thus, the display device DD may be folded. The folding axis may be defined as a short axis parallel to the short side of the display device DD.

In a case that the display device DD may be folded, the first non-folding area NFA1 and the second non-folding areas NFA2 may face each other, and the display device DD may be in-folded to prevent the display surface DS from being exposed to the outside.

Figure 3:
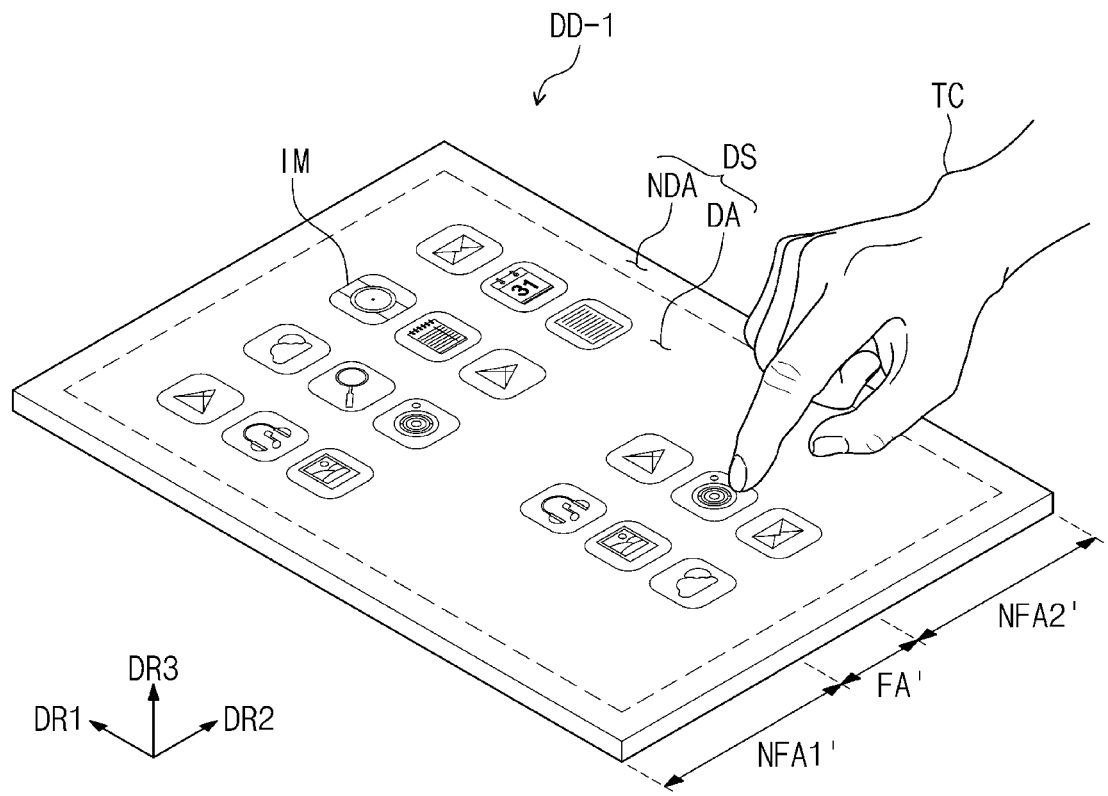
FIG. 3 is a perspective view of the display device according to an embodiment.
Figure 4:
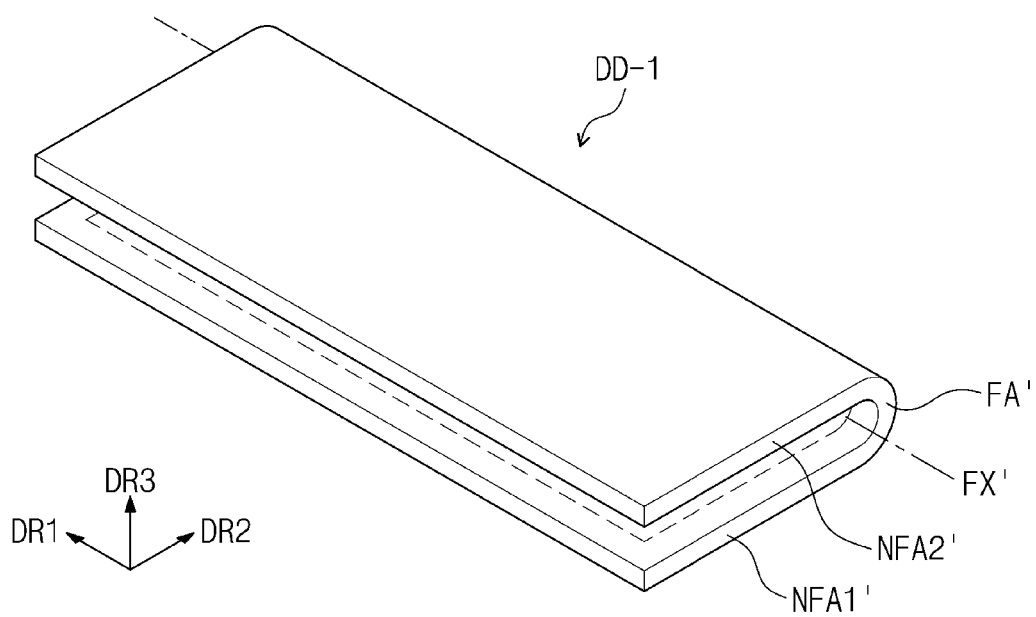
FIG. 4 is a view illustrating a folded state of the display device according to an embodiment.

FIG. 3 is a perspective view of the display device according to an embodiment. FIG. 4 is a view illustrating the folded state of the display device of FIG. 3.

A display device DD-1 illustrated in FIG. 3 may have substantially the same configuration as the display device DD illustrated in FIG. 1, except for a folding operation. Therefore, the folding operation of the display device DD-1 will be described below.

Referring to FIGS. 3 and 4, the display device DD-1 may include a folding area FA' and a plurality of non-folding areas NFA1' and NFA2'. The non-folding areas NFA1' and NFA2' may include a first non-folding area NFA1' and a second non-folding area NFA2'. The folding area FA' may be disposed between the first non-folding area NFA1' and the second non-folding area NFA2'. The folding area FA', the first non-folding area NFA1', and the second non-folding area NFA2' may be arranged or disposed in the second direction DR2.

The folding area FA' may be bent with respect to a folding axis FX' that may be parallel to the first direction DR1 so that the display device DD-1 may be folded. The folding axis FX' may be defined as a long axis that may be parallel to the long side of the display device DD-1. The display device DD illustrated in FIG. 1 may be folded with respect to the short axis. On the other hand, the display device DD-1 illustrated in FIG. 3 may be folded with respect to the long axis. The display device DD-1 may be in-folded so that a display surface DS may not be exposed to the outside.

Hereinafter, the display device DD that may be in-folded with respect to the folding axis FX parallel to the short axis will be described as an example. However, an embodiment is not limited thereto. For example, the display device according to an embodiment may be in-folded with respect to the folding axis parallel to the long axis or out-folded with respect to the folding axis defined on a lower portion of the display device.

Figure 5:
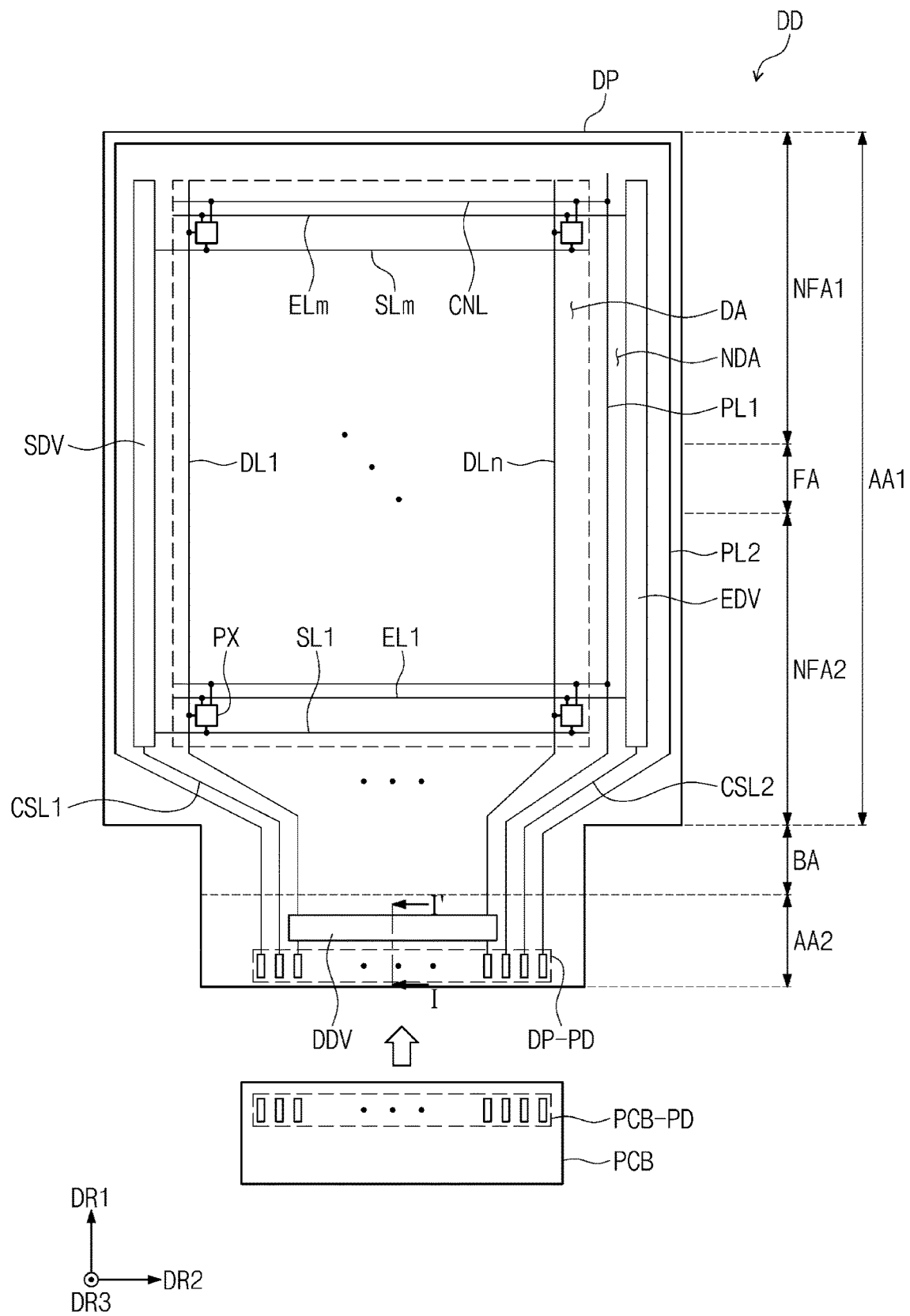
FIG. 5 is a plan view of the display device according to an embodiment.

FIG. 5 is a plan view of the display device of FIG. 1.

Referring to FIG. 5, the display device DD may include a display panel DP, a scan driver SDV, a data driver DDV, and an emission driver EDV.

The display panel DP according to an embodiment may be an emission type display panel, but is not limited thereto. For example, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum rod, and the like within the spirit and the scope of the disclosure. Hereinafter, the display panel DP is described as an organic light emitting display panel.

The display panel DP may be a flexible display panel. For example, the display panel DP may include a plurality of electronic elements disposed on a flexible substrate. The display panel DP may extend longer in the first direction DR1 than in the second direction DR2. The display panel DP may have a plane defined by the first and second directions DR1 and DR2.

The display panel DP may include a first area AA1, a second area AA2, and a bending area BA disposed between the first area AA1 and the second area AA2. The bending area BA may extend in the second direction DR2, and the first area AA1, the bending area BA, and the second area AA2 may be arranged or disposed in the first direction DR1.

The first area AA1 may have long sides that may extend in the first direction DR1 and may be opposite to each other in the second direction DR2. A length of each of the bending area BA and the second area AA2 in the second direction DR2 may be less than that of the first area AA1.

The first area AA1 may include a display area DA and a non-display area NDA around or adjacent to the display area DA. The non-display area NDA may surround or be adjacent to the display area DA. An image may be displayed on the display area DA but may not be displayed on the non-display area NDA. The second area AA2 and the bending area BA may be areas on which an image may not be displayed.

When viewed in the second direction DR2, the first area AA1 may include a first non-folding area NFA1, a second non-folding area NFA2, and a folding area FA disposed between the first non-folding area NFA1 and the second non-folding area NFA2.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, connection lines CNL, and a plurality of signal pads DP-PD. Here, m and n are natural numbers. The pixels PX may be disposed on the display area DA and electrically connected to the scan lines SL1 to SLm, the data lines DL1 to DLn, and the emission lines EL1 to ELm.

A scan driver SDV and an emission driver EDV may be disposed on the non-display area NDA. The scan driver SDV and the emission driver EDV may be disposed on the non-display area NDA that may be adjacent to each of the long sides of the first area AA1. The data driver DDV may be disposed on the second area AA2. The data driver DDV may be manufactured in the form of an integrated circuit chip and mounted on the second area AA2.

The scan lines SL1 to SLm may extend in the second direction DR2 and be electrically connected to the scan driver SDV. The data lines DL1 to DLn may extend in the first direction DR1 and be electrically connected to the data driver DDV via the bending area BA. The emission lines EL1 to ELm may extend in the second direction DR2 and be electrically connected to a gate driver EDV.

The first power line PL1 may extend in the first direction DR1 and be disposed on the non-display area NDA. The first power line PL1 may be disposed between the display area DA and the emission driver EDV. However, an embodiment is not limited thereto, and the first power line PL1 may be disposed between the display area DA and the scan driver SDV.

The first power line PL1 may extend to the second area AA2 via the bending area BA. The first power line PL1 may extend toward a lower end of the second area AA2 when viewed on a plane. The first power line PL1 may receive a first voltage.

The second power line PL2 may be disposed on the non-display area NDA adjacent to the long sides of the first area AA1 and the non-display area NDA facing the second area AA2 with the display area DA therebetween. The second power line PL2 may be disposed outside the scan driver SDV and the emission driver EDV.

The second power line PL2 may extend to the second area AA2 via the bending area BA. The second power line PL2 may extend from the second area AA2 in the first direction DR1 with the data driver DDV therebetween. The second area AA2 may extend toward the lower end of the second area AA2 when viewed on the plane.

The second power line PL2 may receive a second voltage having a level less than that of the first voltage. For convenience of description, although the connection relationship is not illustrated, the second power line PL2 may extend to the display area DA and may be electrically connected to the pixels PX, and the second voltage may be provided to the pixels PX through the second power line PL2.

The connection lines CNL may extend in the second direction DR2 and may be arranged or disposed in the first direction DR1. The connection lines CNL may be electrically connected to the first power line PL1 and the pixels PX. The first voltage may be applied to the pixels PX through the first power line PL1 and the connection lines CNL, which may be connected to each other.

The first control line CSL1 may be electrically connected to the scan driver SDV and extend toward the lower end of the second area AA2 via the bending area BA. The second control line CSL2 may be electrically connected to the emission driver EDV and extend toward the lower end of the second area AA2 via the bending area BA. The data driver DDV may be disposed between the first control line CSL1 and the second control line CSL2.

When viewed on the plane, the plurality of signal pads DP-PD may be disposed adjacent to the lower end of the second area AA2. The data driver DDV, the first power line PL1, the second power line PL2, the first control line CSL1, and the second control line CSL2 may be electrically connected to the signal pads DP-PD.

The data lines DL1 to DLn may be electrically connected to corresponding signal pads DP-PD through the data driver DDV. For example, the data lines DL1 to DLn may be electrically connected to the data driver DDV, and the data drivers DDV may be electrically connected to the signal pads DP-PD, which may respectively correspond to the data lines DL1 to DLn.

The timing controller may control operations of the scan driver SDV, the data driver DDV, and the emission driver EDV. The timing controller may generate a scan control signal, a data control signal, and an emission control signal in response to control signals received from the outside.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from the outside and convert a data format of the image signals to match an interface specification with the data driver DDV and thus provide the converted data format to the data driver DDV.

The scan driver SDV may generate a plurality of scan signals in response to the scan control signal. The scan signals may be applied to the pixels PX through the scan lines SL1 to SLm. The scan signals may be sequentially applied to the pixel PX.

The data driver DDV may generate a plurality of data voltages corresponding to the image signals in response to the data control signal. The data voltages may be provided to the pixels PX through the data lines DL1 to DLn. The emission driver EDV may generate a plurality of emission signals in response to the emission control signal. The emission signals may be applied to the pixels PX through the emission lines EL1 to ELm. The data driver DDV, the scan driver SDV, and the emission driver EDV may be referred to as a driving circuit according to an embodiment. Hereinafter, in description of the driving circuit according to an embodiment, the data driver DDV will be described as an example, and the data driver DDV will be referred to as the driving circuit.

The pixels PX may receive the data voltages in response to the scan signals. The pixels PX may emit light having luminance corresponding to the data voltages in response to the emission signals to display an image. An emission time of the pixels PX may be controlled by the emission signals.

Each of the pixels PX may include an organic light emitting element. The first voltage may be applied to an anode electrode of the organic light emitting element, and the second voltage may be applied to a cathode electrode of the organic light emitting element. The organic light emitting element may operate by receiving the first voltage and the second voltage.

The display device DD may include a circuit board PCB that may be electrically connected to a display panel DP. The circuit board PCB may be a rigid circuit board or a flexible circuit board.

A timing control circuit controlling an operation of the display panel DP may be disposed on the circuit board PCB. Also, an input sensing circuit controlling an input sensing layer ISL may be disposed on the circuit board PCB. Each of the timing control circuit and the input sensing circuit may be mounted on the circuit board PCB in the form of an integrated chip. The timing control circuit and the input sensing circuit according to an embodiment may be mounted on the circuit board PCB in the form of one integrated chip. The circuit board PCB may include circuit board pads PCB-PD electrically connected to the signal pads DP-PD of the display panel. Although not shown, the circuit board PCB may include signal lines electrically connecting the circuit board pads PCB-PD to the timing control circuit and/or the input sensing circuit. Also, the circuit board pads PCB-PD may be output pads, and the circuit board PCB may include an input pad.

Figure 6:
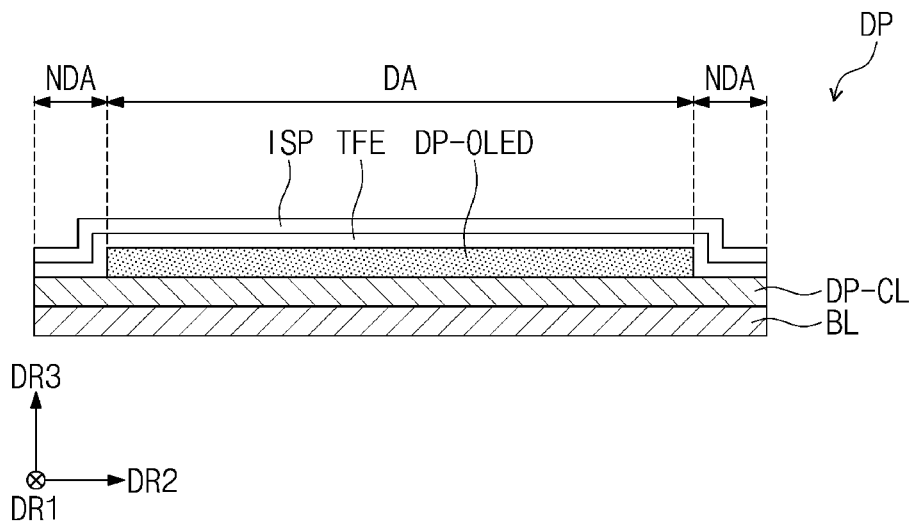
FIG. 6 is a schematic cross-sectional view of a display panel according to an embodiment.

FIG. 6 is a schematic cross-sectional view of the display panel according to an embodiment. For example, FIG. 6 illustrates a schematic cross-sectional view of the display panel as viewed in the first direction DR1.

Referring to FIG. 6, the display panel DP may include a base layer BL, a circuit element layer DP-CL disposed on the base layer BL, a display element layer DP-OLED disposed on the circuit element layer DP-CL, a thin film encapsulation layer TFE disposed on the display element layer DP-OLED, and an input sensing part ISP disposed on the thin film encapsulation layer TFE. The display element layer DP-OLED may be disposed on the display area DA.

The base layer BL may include a display area DA and a non-display area NDA around or adjacent to the display area DA. The base layer BL may include a flexible material. The base layer BL may include a flexible plastic material. For example, the base layer BL may include polyimide (PI). The base layer BL may include polyimide having a low modulus.

The circuit element layer DP-CL may include an insulation layer, a semiconductor pattern, a conductive pattern, and a signal line. The insulation layer, the semiconductor layer, and the conductive layer may be disposed on the base layer BL such as, for example, by coating, deposition, and the like within the spirit and the scope of the disclosure. Thereafter, the insulation layer, the semiconductor layer, and the conductive layer may be selectively patterned through a plurality of photolithography processes to form the semiconductor pattern, the conductive pattern, and the signal line.

The circuit element layer DP-CL may include transistors constituted or formed by the semiconductor pattern, the conductive pattern, and the signal lines. The display element layer DP-OLED may include light emitting elements electrically connected to the transistors. The pixels PX may include the transistors and the light emitting elements.

The thin film encapsulation layer TFE may be disposed on the circuit element layer DP-CL to cover or overlap the display element layer DP-OLED. The thin film encapsulation layer TFE may include an inorganic layer, an organic layer, and an inorganic layer, which may be sequentially laminated. Each of the inorganic layers may include an inorganic material and may protect the pixels against moisture/oxygen. The organic layer may include an organic material and may protect the pixels PX against foreign materials such as dust particles.

The input sensing part ISP may include a plurality of sensors (not shown) for sensing the external input TC (see FIG. 1). The sensors may sense the external input TC (see FIG. 1) in a capacitive manner. The external input TC (see FIG. 1) may include various types of external inputs such as a portion of a user's body, light, heat, a pen, a pressure, or the like within the spirit and the scope of the disclosure.

The input sensing part ISP may be directly manufactured on the thin film encapsulation layer TFE in a case that the display panel DP is manufactured. However, an embodiment is not limited thereto, and the input sensing unit ISP may be provided as a panel that may be separated from the display panel DP and may be attached to the display panel DP by an adhesive layer.

Figure 7:
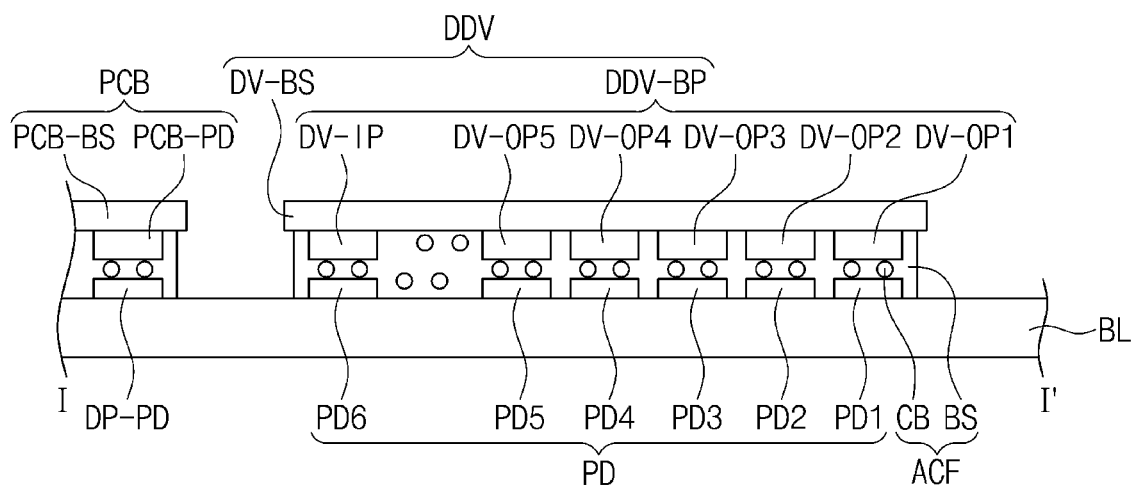
FIG. 7 is a schematic cross-sectional view illustrating a portion or a region of the display device according to an embodiment.

FIG. 7 is a schematic cross-sectional view illustrating a portion or a region of the display device according to an embodiment. FIG. 7 illustrates a schematic cross-sectional view taken along line I-I' of FIG. 5.

Referring to FIGS. 5 and 7, the driving circuit DDV according to an embodiment may include a driving chip DV-BS and a plurality of bumps DDV-BP. The plurality of bumps DDV-BP may be arranged or disposed in a plurality of rows. The plurality of bumps DDV-BP may include output bumps DV-OP1, DV-OP2, DV-OP3, DV-OP4, and DV-OP5 for driving the display panel DP and an input bump DV-IP receiving a control signal and power, which may be provided from the circuit board PCB. The output bumps DV-OP1, DV-OP2, DV-OP3, DV-OP4, and DV-OP5 may be provided in a plurality of rows and, as illustrated in FIG. 7, may include a plurality of first bumps DV-OP1, a plurality of second bumps DV-OP2, a plurality of third bumps DV-OP3, a plurality of fourth bumps DV-OP4, and a plurality of fifth bumps DV-OP5, which may be provided in five rows. However, an embodiment is not limited thereto. For example, the output bumps DV-OP1, DV-OP2, DV-OP3, DV-OP4, and DV-OP5 may be arranged or disposed in two rows to four rows or in six or more rows within the spirit and the scope of the disclosure. Hereinafter, a detailed description of the plurality of bumps DDV-BP provided in the driving circuit DDV will be described below.

A plurality of pads PD corresponding to the plurality of bumps DDV-BP may be disposed on the base layer BL of the display panel DP. The plurality of pads PD may include a first pad PD1, a second pad PD2, a third pad PD3, a fourth pad PD4, a fifth pad PD5, and a sixth pad PD6, which may respectively correspond to the plurality of bumps DDV-BP. The first pad PD1, the second pad PD2, the third pad PD3, the fourth pad PD4, and the fifth pad PD5 may be disposed to correspond to the plurality of output bumps DV-OP1, DV-OP2, DV-OP3, DV-OP4, and DV-OP5, and the sixth pad PD6 may be disposed to correspond to the input bump DV-IP.

An anisotropic conductive film ACF may be disposed between the display panel DP and the driving circuit DDV, and the display panel DP and the driving circuit DDV may be attached or adhered to each other by the anisotropic conductive film ACF. The anisotropic conductive film ACF may include an adhesive resin BS and conductive particles CB. In the anisotropic conductive film ACF, the conductive particles CB may be disposed between the plurality of bumps DDV-BP and the plurality of pads PD to electrically connect the plurality of bumps DDV-BP to the plurality of pads PD. The display panel DP and the driving circuit DDV may be electrically connected to each other with the anisotropic conductive film ACF therebetween through pressing and heating processes. However, an embodiment is not limited thereto. For example, the anisotropic conductive film ACF may be omitted in the display device DD according to an embodiment, and the display panel DP and the driving circuit DDV may be electrically connected to each other through an ultrasonic bonding process.

The circuit board PCB may be electrically connected to the display panel DP through the anisotropic conductive film ACF. The circuit board PCB may be disposed on the circuit base layer PCB-BS and the circuit base layer PCB-BS may include a circuit board pad PCB-PD that may be electrically connected to the signal pads DP-PD of the display panel DP.

Hereinafter, an example arrangement of the plurality of bumps of the driving circuit DDV will be described with reference to FIG. 8.

Figure 8:
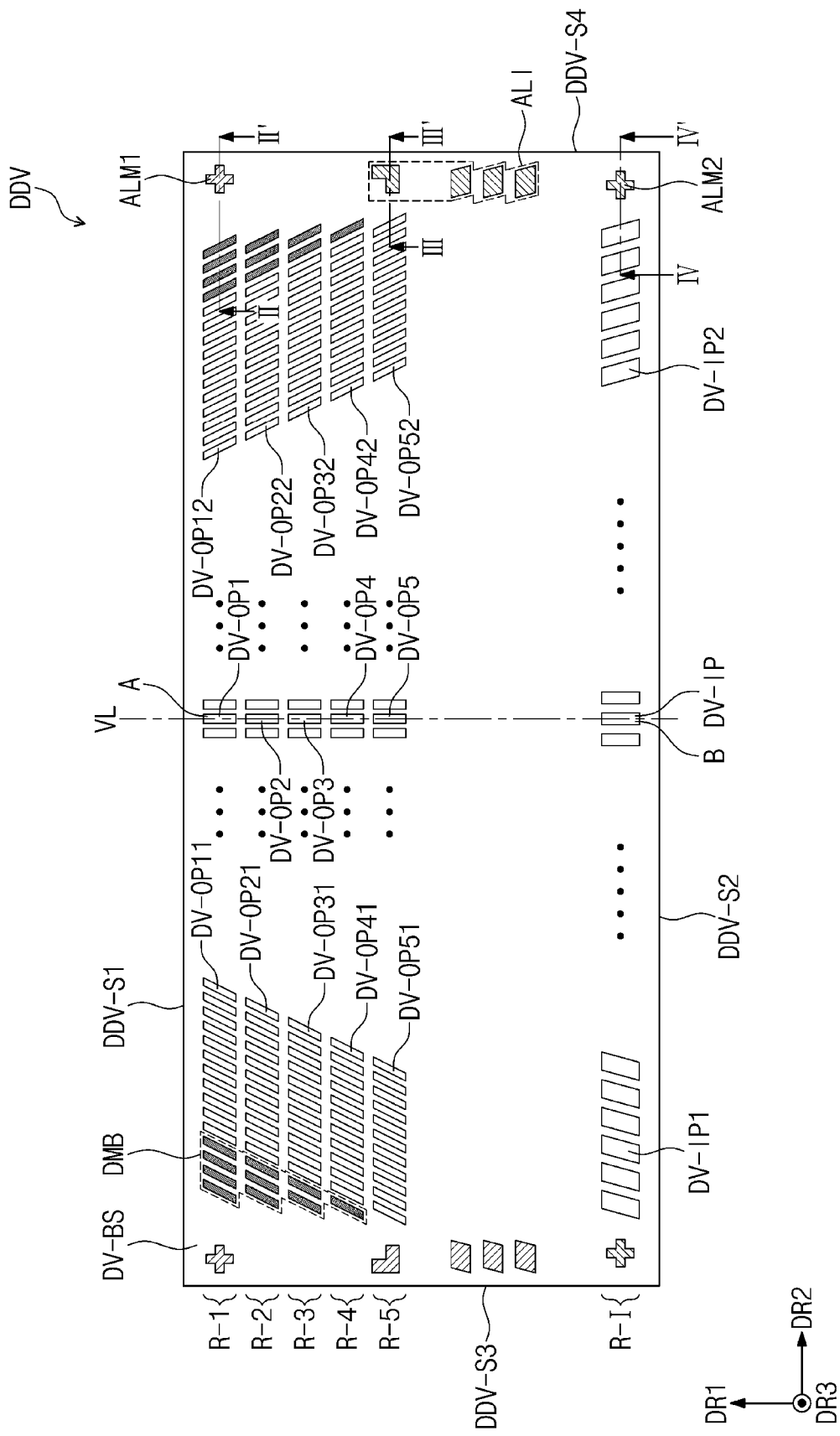
FIG. 8 is a plan view illustrating an arrangement of bumps of a driving circuit according to an embodiment.

FIG. 8 is a plan view illustrating an arrangement of bumps of a driving circuit according to an embodiment.

Referring to FIGS. 7 and 8, the plurality of bumps DDV-BP may include a plurality of first bumps DV-OP1, a plurality of second bumps DV-OP2, a plurality of third bumps DV-OP3, a plurality of fourth bumps DV-OP4, and a plurality of fifth bumps DV-OP5, which may be disposed in the plurality of output rows R-1, R-2, R-3, R-4, and R-5. FIGS. 7 and 8 illustrate that the output bump may include five output rows R-1, R-2, R-3, R-4, and R-5, but is not limited thereto. For example, the output bump may be arranged or disposed in two or four rows or in six or more rows within the spirit and the scope of the disclosure. The first row R-1 of the plurality of output rows R-1, R-2, R-3, R-4, and R-5 may be a row that may be closest to the display area DA (see FIG. 5) when being applied to the display device according to an embodiment. For example, the first row R-1 may be defined adjacent to the first long side DDV-S1, which may be adjacent to the display area DA, among the long sides DDV-S1 and DDV-S2 of the driving circuit DDV. The input row R-I may be defined adjacent to the second long side DDV-S2 spaced apart from the display area DA. Although not shown, the driving circuit DDV may include a plurality of signal lines that may be respectively electrically connected to the plurality of output bumps and the plurality of input bumps. Each of the plurality of output bumps and the plurality of input bumps may be disposed in the second direction DR2 and be spaced apart from each other in the first direction DR1. The long sides DDV-S1 and DDV-S2 of the driving circuit DDV may extend in the second direction DR2, and the short sides DDV-S3 and DDV-S4 of the driving circuit DDV may extend in the first direction DR1. Hereinafter, in this specification, the first direction DR1 may be referred to as a column direction, and the second direction DR2 may be referred to as a row direction.

Each of the plurality of first bumps DV-OP1, the plurality of second bumps DV-OP2, the plurality of third bumps DV-OP3, the plurality of fourth bumps DV-OP4, and the plurality of fifth bumps DV-OP5 may include n bumps. For example, the number of bumps constituting each of the plurality of first bumps DV-OP1, the plurality of second bumps DV-OP2, the plurality of third bumps DV-OP3, the plurality of fourth bumps DV-OP4, and the plurality of fifth bumps DV-OP5 may be the same. However, an embodiment is not limited thereto. For example, the number of bumps arranged or disposed in each column may be different depending on the structure of the display device.

For convenience of illustration, a first reference bump may be illustrated as 'A' in FIG. 8. First through fifth reference bumps may be collectively referred to as reference bumps for convenience of description. A first reference bump A disposed at a center among the plurality of first bumps DV-OP1 and a second reference bump disposed at a center among the plurality of second bumps DV-OP2 may be disposed in a reference line VL defined in the first direction DR1. Also, a third reference bump disposed at a center among the plurality of third bumps DV-OP3 may also be disposed in the reference line VL. Similarly, a fourth reference bump disposed at a center among the plurality of fourth bumps DV-OP4 may also be disposed in the reference line VL, and a fifth reference bump disposed at a center among the plurality of fifth bumps DV-OP5 may also be disposed in the reference line VL.

The plurality of first bumps DV-OP1 may include a plurality of eleventh bumps DV-OP11 disposed at a relatively left side with respect to the first reference bump A and a plurality of twelfth bumps DVD-OP12 disposed on a right side with respect to the first reference bump A.

Similar to the plurality of first bumps DV-OP1, the plurality of second bumps DV-OP2 may include a plurality of twenty-first bumps DV-OP21 disposed at a relatively left side with respect to the second reference bump and a plurality of twenty-second bumps DV-OP22 disposed at a relatively right side with respect to the second reference bump. Also, the plurality of third bumps DV-OP3 may also include a plurality of thirty-first bumps DV-OP31 disposed at a relatively left side with respect to the third reference bump and a plurality of thirty-second bumps DV-OP32 disposed at a relatively right side with respect to the third reference bump. Similarly, the plurality of fourth bumps DV-OP4 may include a plurality of forty-first bumps DV-OP41 disposed at a relatively left side with respect to the fourth reference bump and a plurality of forty-second bumps DV-OP42 disposed at a relatively right side with respect to the fourth reference bump, and the plurality of fifth bumps DV-OP5 may include a plurality of fifty-first bumps DV-OP51 disposed at a relatively left side with respect to the fifth reference bump and a plurality of fifty-second bumps DV-OP52 disposed at a relatively right side with respect to the fifth reference bump.

Each of the plurality of eleventh bumps DV-OP11, the plurality of twenty-first bumps DV-OP21, the plurality of thirty-first bumps DV-OP31, and the plurality of forty-first bumps DV-OP41, and the plurality of fifty-first bumps DV-OP51, which may be disposed at the relatively left side with respect to the reference line VL, may be disposed at a predetermined inclination with respect to the reference line VL. The predetermined inclination may be an inclination having a constant value, that is, a constant inclination. For example, each of the plurality of eleventh bumps DV-OP11, the plurality of twenty-first bumps DV-OP21, the plurality of thirty-first bumps DV-OP31, the plurality of forty-first bumps DV-OP41, and the plurality of fifty-first bumps DV-OP51 may be disposed to form an acute angle with respect to the reference line VL in a clockwise direction from the reference line VL to the plurality of respective bumps. Symmetrically, each of the plurality of twelfth bumps DV-OP12, the plurality of twenty-second bumps DV-OP22, the plurality of thirty-second bumps DV-OP32, the plurality of forty-second bumps DV-OP42, and the plurality of fifty-second bumps DV-OP52, which may be disposed at the relatively right side with respect to the reference line VL, may be disposed to form an acute angle with respect to the reference line VL in a counterclockwise direction from the reference line VL to the plurality of respective bumps.

In a case that the number of plurality of first bumps DV-OP1 and the plurality of second bumps DV-OP2 may be the same, an inclination of an n-th bump among the plurality of first bumps DV-OP1 and an inclination of an n-th bump among the plurality of second bumps DV-OP2 may be the same. Similarly, in a case that the number of the plurality of first bumps DV-OP1, the number of the plurality of third bumps DV-OP3, the number of the plurality of fourth bumps DV-OP4, and the number of the plurality of fifth bumps DV-OP5 may be the same, an inclination of an n-th bump among the plurality of first bumps DV-OP1, an inclination of an n-th bump among the plurality of third bumps DV-OP3, an inclination of an n-th bump among the plurality of fourth bumps DV-OP4, and an inclination of an n-th bump among the plurality of fifth bumps DV-OP5 may be the same.

A pitch between the plurality of first bumps DV-OP1 may be less than a pitch between the plurality of second bumps DV-OP2. A pitch between the plurality of second bumps DV-OP2 may be less than a pitch between the plurality of third bumps DV-OP3. A pitch between the plurality of third bumps DV-OP3 may be less than a pitch between the plurality of fourth bumps DV-OP4. A pitch between the plurality of fourth bumps DV-OP4 may be less than a pitch between the plurality of fifth bumps DV-OP5. For example, intervals between the bumps may increase from the plurality of first bumps DV-OP1 to the plurality of fifth bumps DV-OP5.

In a case that the bump spaced farthest from the reference line VL is referred to as the outermost bump, a distance from the reference line VL to the first outermost bump in the first row R-1 may be less than a distance from the reference line VL to the second outermost bump in the second row R-2. Also, a distance from the reference line VL to the second outermost bump in the second row R-2 may be less than a distance from the reference line VL to the third outermost bump in the third row R-3. Similarly, a distance from the reference line VL to the third outermost bump in the third row R-3 may be less than a distance from the reference line VL to the fourth outermost bump in the fourth row R-4, and a distance from the reference line VL to the fourth outermost bump in the fourth row R-4 may be less than a distance from the reference line VL to the fifth outermost bump in the fifth row R-5. In other words, the bumps may be disposed to be spaced farther from the reference line VL in the direction from the outermost bump to the fifth outermost bump. The distance from each of the short sides DDV-S3 and DDV-S4 of the driving circuit DDV to the first outermost bump may be greater than that from each of the short sides DDV-S3 and DDV-S4 to each of the second to fifth outermost bumps.

Similar to the output bump, the input bump DV-IP disposed in the input row R-I may include a reference input bump B disposed in the reference line VL, a plurality of first input bumps DV-IP1 disposed at a relatively left side with respect to the first reference input bump B, and a plurality of second input bumps DV-IP2 disposed at a relatively right side with respect to the first reference input bump B.

The driving circuit DDV may include alignment mark bumps ALM1 and ALM2 disposed at ends in at least one row of the plurality of rows R-1, R-2, R-3, R-4, R-5, and RI. In an embodiment, the alignment mark bumps ALM1 and ALM2 may include a first alignment mark bump ALM1 disposed at an end in the first row R-1 and a second alignment mark bump ALM2 disposed at an end in the input row R-I. In an embodiment, the second alignment mark bump ALM2 may be omitted.

The alignment mark bumps ALM1 and ALM2 may be applied as an identification mark for identifying the position of the driving circuit DDV or aligning the driving circuit DDV and the display panel DP in the process of bonding the driving circuit DDV to the display panel DP. In FIG. 8, the alignment mark bumps ALM1 and ALM2 having a substantially cross shape are illustrated as having a substantially cross shape, but the disclosure is not limited thereto. For example, the alignment mark bumps ALM1 and ALM2 may have various shapes as long as the alignment mark bumps ALM1 and ALM2 are configured or shaped to align the driving circuit DDV and the display panel DP in the process of bonding the driving circuit DDV to the display panel DP.

The alignment mark bumps ALM1 and ALM2 may protrude by substantially the same thickness as each of the plurality of bumps DDV-BP. In this specification, "substantially the same" means that numerical values such as the thickness of each element are not only exactly the same, but also the same in a range that may include differences that may occur due to process errors in spite of the same design. Each of the plurality of bumps DDV-BP may have a thickness in a range of about 7 μm to about 10 μm. Each of the alignment mark bumps ALM1 and ALM2 may have a thickness in a range of about 7 μm to about 10 μm.

The alignment mark bumps ALM1 and ALM2 may include the same or similar material as the plurality of bumps DDV-BP. The alignment mark bumps ALM1 and ALM2 may include the same conductive metal as the plurality of bumps DDV-BP. In an embodiment, the plurality of bumps DDV-BP and the alignment mark bumps ALM1 and ALM2 may be formed through the same process. For example, the plurality of bumps DDV-BP and the alignment mark bumps ALM1 and ALM2 may be formed in the same process through a single patterning process after depositing a metal on the driving chip DV-BS.

The alignment mark bumps ALM1 and ALM2 may be disposed at the outermost side in at least one row of the plurality of rows R-1, R-2, R-3, R-4, and R-5, RI in which the plurality of bumps DDV-BP may be disposed. For example, the alignment mark bumps ALM1 and ALM2 may be disposed at both ends of at least one of the plurality of rows R-1, R-2, R-3, R-4, R-5, and RI and may be disposed adjacent to both short sides DDV-S3 and DDV-S4 of the driving circuit DDV. As the alignment mark bumps ALM1 and ALM2 may be disposed at both ends of each row, a function for aligning the driving circuit DDV may be performed.

The driving circuit DDV may include an alignment inspection mark bump ALI overlapping the alignment mark bumps ALM1 and ALM2 in the column direction. Hereinafter, in this specification, the alignment inspection mark bump ALI in the column direction may be applied as an identification mark for identifying the position of the driving circuit DDV in the process of inspecting the alignment of the driving circuit DDV or determines whether the alignment of the driving circuit DDV is appropriate. The alignment inspection mark bump ALI may be provided in plurality. At least one of the alignment inspection mark bumps ALI may be disposed parallel to at least one row of the plurality of rows R-1, R-2, R-3, R-4, R-5, and R-I in which the plurality of bumps DDV-BP may be disposed. For example, a pair of alignment inspection mark bumps ALI may be arranged or disposed parallel to the fifth row R-5.

Each of the alignment inspection mark bumps ALI may protrude by substantially the same thickness as each of the alignment mark bumps ALM1 and ALM2. The alignment inspection mark bump ALI may include the same or similar material as the alignment mark bumps ALM1 and ALM2 and may be formed through the same process.

The plurality of bumps provided in the driving circuit DDV may include dummy bumps DMB disposed in at least one row of the plurality of rows R-1, R-2, R-3, R-4, R-5, and RI. Each of the dummy bumps DMB may be disposed between the outermost bump and each of both the short sides DDV-S3 and DDV-S4 in at least one row of the plurality of rows R-1, R-2, R-3, R-4, R-5, and RI. In an embodiment, the dummy bump DMB may be disposed in each of the first row R-1, the second row R-2, the third row R-3, and the fourth row R-4. The dummy bump DMB disposed in the first row R-1 may be disposed between the first outermost bump and the first alignment mark bump ALM1.

Since distances from the short sides DDV-S3 and DDV-S4 of the driving circuit DDV to the outermost bump of each of the plurality of rows R-1, R-2, R-3, R-4, R-5 and RI may be different from each other, the dummy bump DMB may be provided to compensate for the distances that may be different from each other. As the dummy bump DMB is disposed, the distances from the short sides DDV-S3 and DDV-S4 of the driving circuit DDV to the outermost bump or the outermost dummy bump DMB may be the same in the first row R-1 to the fifth row R-5.

The dummy bump DMB may protrude by substantially the same thickness as each of the alignment mark bumps ALM1 and ALM2. The dummy bump DMB may include the same or similar material as the alignment mark bumps ALM1 and ALM2 and may be formed through the same process.

The dummy bump DMB may be a bump that may not output a separate signal. However, an embodiment is not limited thereto. For example, the dummy bump DMB may be a bump that may output an output signal outputted through the plurality of bumps disposed in each row in which the dummy bump DMB may be disposed.

The display device according to an embodiment may include the alignment mark bumps ALM1 and ALM2 to prevent the base layer BL of the display panel DP from being bent or prevent the display panel DP from being cracked due to a pressure occurring while the driving circuit DDV presses the display panel DP. Hereinafter, it will be described in more detail with reference to schematic cross-sectional views of FIGS. 9A to 11.

Figure 9A:
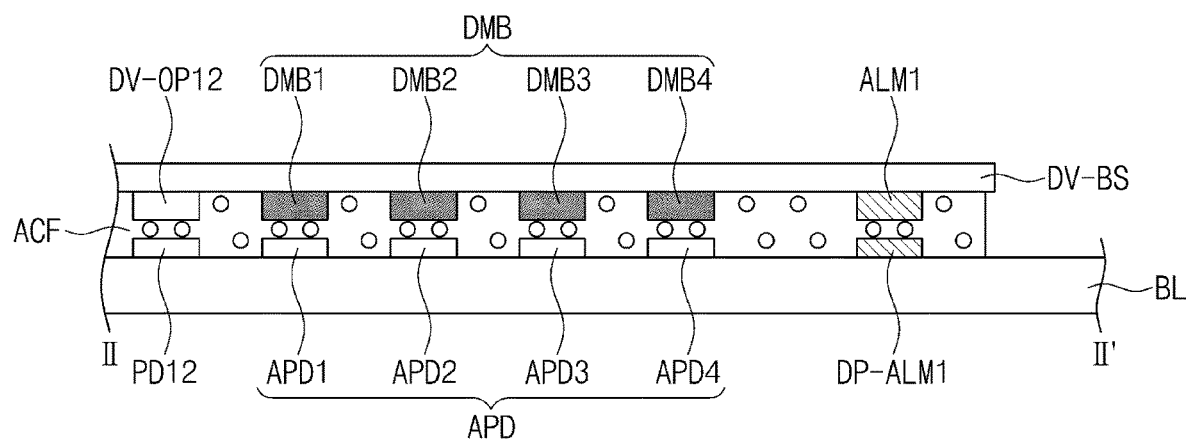
FIGS. 9A and 9B are schematic cross-sectional views illustrating a portion or a region of the display device according to an embodiment.
Figure 9B:
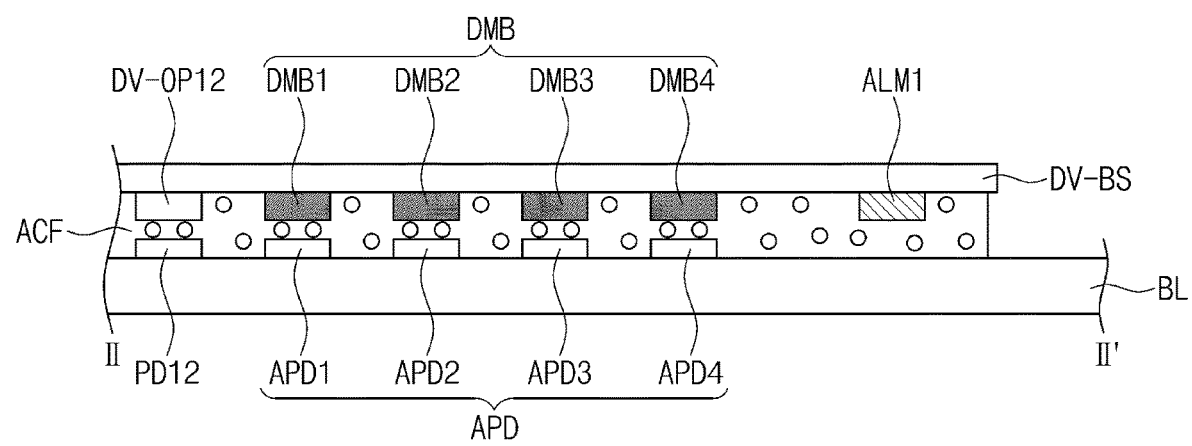
Figure 10:
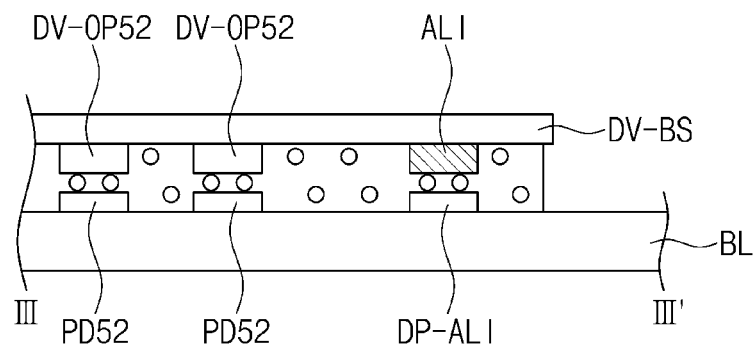
FIG. 10 is a schematic cross-sectional view illustrating the other or another portion or region of the display device according to an embodiment.
Figure 11:
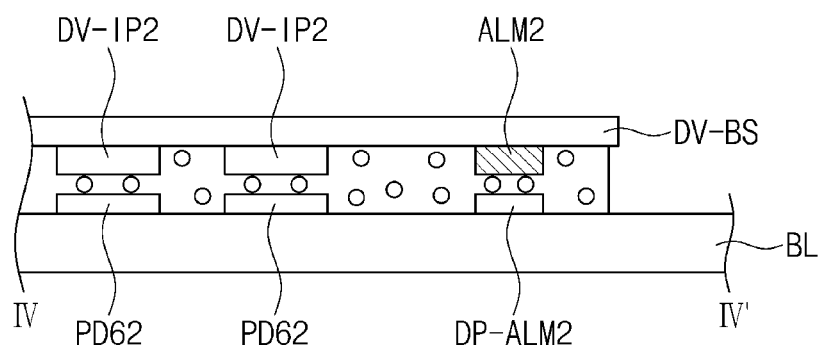
FIG. 11 is a schematic cross-sectional view illustrating the other or another portion or region of the display device according to an embodiment.

FIGS. 9A and 9B are schematic cross-sectional views illustrating a portion or a region of the display device according to an embodiment. FIG. 10 is a schematic cross-sectional view illustrating the other or another portion or region of the display device according to an embodiment. FIG. 11 is a schematic cross-sectional view illustrating the other or another portion or region of the display device according to an embodiment. FIGS. 9A and 9B illustrate schematic cross-sectional views of a state, in which the display panel and the driving circuit may be bonded to each other, with respect to a cutoff line taken along line II-IF of FIG. 8. FIG. 10 illustrates a schematic cross-sectional view of a state, the display panel and the driving circuit may be bonded to each other, with respect to a cutoff line of FIG. 8. FIG. 11 illustrates a schematic cross-sectional view of a state, the display panel and the driving circuit may be bonded to each other, with respect to a cutoff line IV-IV' of FIG. 8.

Referring to FIGS. 5, 8, 9A, and 9B, in the display device DD according to an embodiment, the display panel DP and the driving circuit DDV may be bonded to each other through the anisotropic conductive film ACF, and the pads of the display panel DP may be disposed to correspond to the plurality of bumps disposed in the driving circuit DDV. As illustrated in FIGS. 9A and 9B, the first pad PD12 may be disposed to correspond to the first bump DV-OP12 disposed in the first row R-1 among the plurality of bumps. The first bump DV-OP12 may be an output bump for driving the display panel DP, and the first pad PD12 may be an input pad for receiving a signal from the driving circuit DDV. Although a first pad PD12 is illustrated in FIGS. 9A and 9B, the display panel DP may include a plurality of first pads PD12 corresponding to the plurality of first bumps DB- OP12 arranged or disposed in the first row R-1 within the spirit and the scope of the disclosure.

A thickness of the first bump DV-OP12 disposed in the first row R-1 and a thickness of the dummy bump DVB may be substantially the same. The thickness of the first bump DV-OP12 disposed in the first row R-1 and the thickness of the first alignment mark bump ALM1 may be substantially the same. The first bump DV-OP12, the dummy bump DMB, and the first alignment mark bump ALM1 may include the same or similar material and be formed through the same process.

The display panel DP may include an additional pad APD corresponding to the dummy bump DMB disposed in the driving circuit DDV. As illustrated in FIGS. 9A and 9B, the display panel DP may include a plurality of additional pads APD to correspond to a plurality of dummy bumps DMB disposed in the first row R-1 of the driving circuit DDV. In an embodiment, the first dummy bump DMB1, the second dummy bump DMB2, the third dummy bump DMB3, and the fourth dummy bump DMB4 may be disposed in the first row R-1 of the driving circuit DDV, and correspondingly, the display panel DP may include a first additional pad APD1, a second additional pad APD2, a third additional pad APD3, and a fourth additional pad APD4.

The additional pad APD may include the same or similar material as the first pad PD12 and may have the same thickness as the first pad PD12. The additional pad APD may be formed through the same process as the first pad PD12. In an embodiment, the additional pad APD disposed on the display panel DP may be omitted. For example, the pad corresponding to the dummy bump DMB may not be disposed on the display panel DP.

The display panel DP may include a panel alignment mark bump corresponding to the alignment mark bump disposed in the driving circuit DDV. As illustrated in FIG. 9A, the display panel DP may include a first panel alignment mark bump DP-ALM1 to correspond to the first alignment mark bump ALM1 disposed in the first row R-1 of the driving circuit DDV. The panel alignment mark bump may be applied as an identification mark for identifying the position of the display panel DP in the process of bonding the driving circuit DDV and the display panel DP or aligning the display panel DP and the driving circuit DDV through the alignment with the alignment mark bump. The panel alignment mark bump DP-ALM1 may have the same thickness as each of the first pad PD12 and the additional pad APD. The panel alignment mark bump DP-ALM1 may include the same or similar material as the first pad PD12 and the additional pad APD and may be formed through the same process as the first pad PD12 and the additional pad APD.

Alternatively, as illustrated in FIG. 9B, the panel alignment mark bump DP-ALM1 may be omitted, and a pad corresponding to the first alignment mark bump ALM1 may not be disposed. In this case, the display panel DP may include a panel alignment mark (not shown) having no separate stepped portion.

Referring to FIGS. 5, 8, and 10, a thickness of the fifth bump DV-OP52 disposed in the fifth row R-5 of the driving circuit DDV and a thickness of the alignment inspection mark bump ALI may be substantially the same. The fifth bump DV-OP52 and the alignment inspection mark bump ALI may include the same or similar material and be formed through the same process.

The display panel DP may include a fifth pad PD52 disposed to correspond to the fifth bump DV-OP52 disposed in the fifth row R-5 of the driving circuit DDV. The display panel DP may include a panel alignment inspection mark bump DP-ALI disposed to correspond to the alignment inspection mark bump ALI disposed parallel to the fifth row R-5 of the driving circuit DDV. The panel alignment inspection mark bump DP-ALI may have substantially the same thickness as the fifth pad PD52. The panel alignment inspection mark bump DP-ALI may be formed through the same process as the fifth pad PD52. In an embodiment, the panel alignment inspection mark bump DP-ALI may be omitted, and the display panel DP may include a panel alignment inspection mark (not shown) having no separate stepped portion.

Referring to FIGS. 5, 8, and 11, a thickness of the input bump DV-IP2 disposed in the input row RI of the driving circuit DDV and a thickness of the second alignment mark bump ALM2 may be substantially the same. The input bump DV-IP2 and the second alignment mark bump ALM2 may include the same or similar material and may be formed through the same process.

The display panel DP may include a sixth pad PD62 disposed to correspond to the input bump DV-IP2 disposed in the input row R-I of the driving circuit DDV. The sixth pad PD62 may be an output pad for transmitting a signal provided from the circuit board PCB to the driving circuit DDV. The display panel DP may include a second panel alignment inspection mark bump DP-ALM2 disposed to correspond to the second alignment mark bump ALM2 disposed parallel to the input row RI of the driving circuit DDV. The second panel alignment inspection mark bump DP-ALM2 may have substantially the same thickness as the sixth pad PD62. The second panel alignment inspection mark bump DP-ALM2 may be formed through the same process as the sixth pad PD62. In an embodiment, the second panel alignment inspection mark bump DP-ALM2 may be omitted, and the display panel DP may include a panel alignment mark (not shown) having no separate stepped portion.

The display device according to an embodiment may include the alignment mark bump disposed adjacent to the short side of the driving circuit to prevent the display panel from being bent or cracked by the pressure occurring while the display panel and the driving circuit are pressed. For example, in the case of the display panel including the flexible base layer, the display panel may be easily bent or cracked while the display panel and the driving circuit are pressed. However, according to the disclosure, in the alignment mark disposed at the end of the driving circuit, since the alignment mark protrudes to substantially the same thickness as each of the output bump and the input bump, the pressure applied to the display panel may be uniform to prevent the display panel from being bent and cracked.

The limitation in which the difference in pressure occurs due to the non-uniform distance between the outermost bump and the driving circuit in each row, in which the plurality of bumps may be disposed, by the arrangement of the plurality of bumps disposed in the driving circuit may be prevented by forming the dummy bump in each row, in which the plurality of bumps may be disposed, to compensate for the spaced distance. However, in the alignment mark disposed closer to the end of the driving circuit than the dummy bump according to the disclosure, in a case that the alignment mark is formed, the alignment mark bump and the plurality of bumps may be formed through the same process to prevent the display panel overlapping the outermost portion of the driving circuit from being bent.

Figure 12:
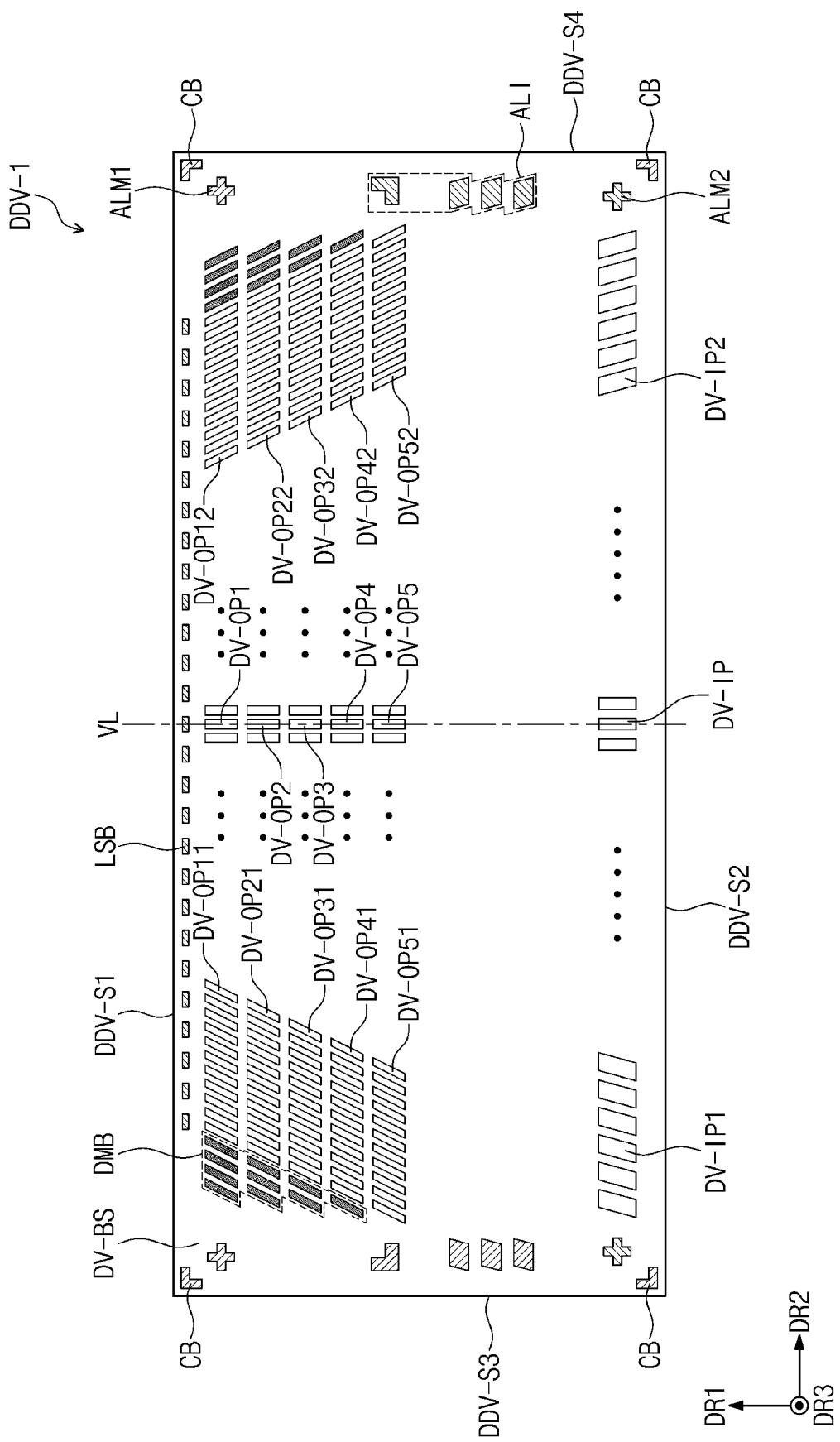
FIGS. 12 and 13 are plan views illustrating an arrangement of bumps of the driving circuit according to an embodiment.
Figure 13:
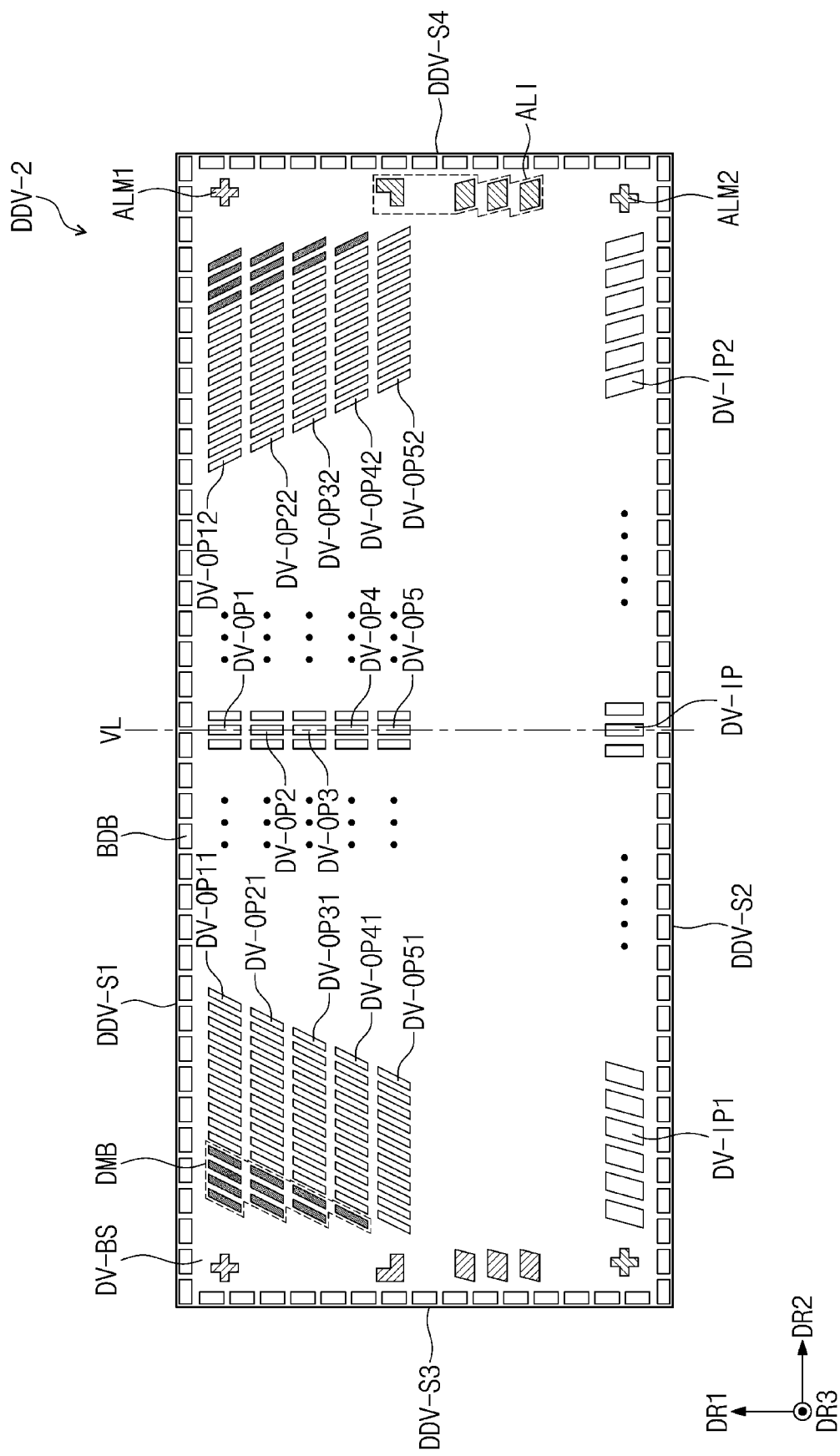

FIGS. 12 and 13 are plan views illustrating an arrangement of bumps of a driving circuit according to an embodiment. Hereinafter, in description of driving circuits DDV-1 and DDV-2 according to an embodiment with reference to FIGS. 12 and 13, the same reference numerals will be given to the same components as those described above, and their detailed description will be omitted.

Referring to FIG. 12, the driving circuit DDV-1 according to an embodiment may include at least one corner bump CB disposed at a corner portion of the driving circuit DDV-1. The corner bump CB may be disposed to be adjacent to a corner of the driving circuit DDV-1, for example, each of points at which long sides DDV-S1 and DDV-S2 and short sides DDV-S3 and DDV-S4 may meet each other. In FIG. 12, a structure in which the corner bump CB may be disposed at each of four corner portions of the driving circuit DDV-1, but at least one of the four corner bumps CB may be omitted.

The corner bump CB may have substantially the same thickness as a first alignment mark bump ALM1. The corner bump CB may include substantially the same or similar material as the first alignment mark bump ALM1 and be formed through the same process. However, an embodiment is not limited thereto. For example, the corner bump CB may have a thickness less than that of the first alignment mark bump ALM1.

The driving circuit DDV-1 according to an embodiment may include a plurality of long side bumps LSB disposed adjacent to one of the long sides DDV-S1 and DDV-S2 of the driving circuit DDV-1. In an embodiment, the plurality of long side bumps LSB may be disposed adjacent to a first long side DDV-S1, which may be adjacent to a display area DA, of the long sides DDV-S1 and DDV-S2 of the driving circuit DDV-1. However, an embodiment is not limited thereto. For example, the plurality of long side bumps LSB may be disposed adjacent to a second long side DDV-S2 of the driving circuit DDV-1. Although not illustrated, the plurality of long side bumps LSB may be arranged or disposed so as not to overlap first to fifth bumps DV-OP1 to DV-OP5 and portions at which a plurality of signal lines electrically connected to an input bump DV-IP may be disposed.

Each of the plurality of long side bumps LSB may have substantially the same thickness as the first alignment mark bump ALM1. The plurality of long side bumps LSB may include substantially the same or similar material as the first alignment mark bump ALM1 and may be formed through the same process. However, an embodiment is not limited thereto. For example, each of the plurality of long side bumps LSB may have a thickness less than that of the first alignment mark bumps ALM1.

Referring to FIG. 13, a driving circuit DDV-2 according to an embodiment may include a plurality of edge bumps BDB disposed along an edge of the driving circuit DDV-2. The plurality of edge bumps BDB may be disposed adjacent to the long sides DDV-S1 and DDV-S2 and short sides DDV-S3 and DDV-S4 of the driving circuit DDV-2, respectively. Although not illustrated, the plurality of edge bumps BDB may be arranged or disposed so as not to overlap the first to fifth bumps DV-OP1 to DV-OP5 and the portions at which the plurality of signal lines electrically connected to the input bump DV-IP may be disposed.

Each of the plurality of edge bumps BDB may have substantially the same thickness as the first alignment mark bump ALM1. The plurality of edge bumps BDB may include substantially the same or similar material as the first alignment mark bump ALM1 and be formed through the same process. However, an embodiment is not limited thereto. For example, each of the plurality of edge bumps BDB may have a thickness less than that of the first alignment mark bump ALM1.

The driving circuits DDV-1 and DDV-2 according to an embodiment may include additional bumps disposed at the outermost portions of the driving circuits DDV-1 and DDV-2, for example, at least one corner bump CB disposed at the corner portion of the driving circuit DDV-1, the plurality of long side bumps LSB disposed adjacent to one of the long sides DDV-S1 and DDV-S2 of the driving circuit DDV-1, and the plurality of edge bumps BDB disposed along the edge of the driving circuit DDV-2 to prevent the base layer of the display panel, which may overlap the outermost portion of each of the driving circuits DDV-1 and DDV-2, from being bent or cracked by the pressure occurring while the driving circuits DDV-1 and DDV-2 may be pressed to the display panel.

According to an embodiment, the alignment mark bump that may be provided by allowing the alignment mark disposed at the end of the driving circuit to protrude by the thickness of the bump provided in the driving circuit may be provided to prevent the limitation such as the bending of the display panel from occurring in the process of bonding the driving circuit to the display panel, thereby improving the durability and reliability of the display device.

It will be apparent to those skilled in the art that various modifications and variations may be made in the disclosure. Thus, it is intended that the disclosure covers the modifications and variations provided they come within the scope of the appended claims and their equivalents. Therefore, the scope of the disclosure is not limited to the contents described in the detailed description of the specification, but should be determined by the claims.

What is claimed is:

1. A display device comprising:
   a display panel comprising a display area and a non-display area adjacent to the display area; and
   a driving circuit disposed on the non-display area, the driving circuit comprising:
   a driving chip;
   a plurality of bumps extending away from a first surface of the driving chip and disposed in a plurality of rows, each of the plurality of bumps being able to electrically connect the driving circuit with circuit board pads of the non-display area; and
   a first alignment mark bump extending away from the first surface of the driving chip and disposed at an end of at least one of the plurality of rows.

2. The display device of claim 1, wherein
   the plurality of bumps comprises a plurality of first bumps disposed in a first row among the plurality of rows, the first row being adjacent to the display area, and
   the first alignment mark bump is disposed in the first row.

3. The display device of claim 2, wherein
   the plurality of first bumps comprises:
   a plurality of second bumps disposed at a left side with respect to a first reference bump; and
   a plurality of third bumps disposed on a right side with respect to the first reference bump,
   the plurality of second bumps form an acute angle with respect to a reference line in a clockwise direction from the reference line to the plurality of second bumps, the reference line being at a center of the driving circuit in a direction intersecting a direction of the plurality of rows of the driving circuit, and the plurality of third bumps form an acute angle with respect to the reference line in a counterclockwise direction from the reference line to the plurality of third bumps.

4. The display device of claim 2, wherein the first alignment mark bump has a thickness substantially same as a thickness of each of the plurality of first bumps.

5. The display device of claim 2, wherein the plurality of bumps further comprise dummy bumps disposed between the plurality of first bumps and the first alignment mark bump in the first row.

6. The display device of claim 2, wherein the plurality of first bumps disposed in the first row comprises an output bump that outputs a driving signal that drives a light emitting element disposed in the display panel.

7. The display device of claim 2, wherein
the first row in which the plurality of first bumps are disposed is arranged at an end of the driving circuit, and
the plurality of bumps comprise a plurality of input bumps disposed in an input row arranged at another end facing the end of the driving circuit.

8. The display device of claim 7, wherein the driving circuit further comprises a second alignment mark bump disposed at an end of the input row.

9. The display device of claim 1, wherein the display panel comprises:
a plurality of pads corresponding to the plurality of bumps; and
a panel alignment mark bump corresponding to the first alignment mark bump.

10. The display device of claim 1, wherein a thickness of the first alignment mark bump is in a range of about 8 μm to about 10 μm.

11. The display device of claim 1, wherein
the driving circuit further comprises an alignment inspection mark bump that overlaps the first alignment mark bump in a column direction, and
the alignment inspection mark bump has a thickness substantially same as a thickness of the first alignment mark bump.

12. The display device of claim 1, wherein
the display panel comprises a first non-folding area, a folding area, and a second non-folding area, and
the folding area folds with respect to a folding axis.

13. The display device of claim 1, wherein
the first alignment mark bump is disposed adjacent to an end of the driving chip.

14. The display device of claim 1, further comprising:
an anisotropic conductive film disposed between the driving circuit and the display panel.

15. The display device of claim 1, wherein the plurality of bumps and the first alignment mark bump comprise a same material.

16. The display device of claim 1, wherein
the driving circuit further comprises a corner bump disposed at each of corners of the driving circuit, and
the corner bump has a thickness substantially same as a thickness of the first alignment mark bump.

17. The display device of claim 1, wherein
the driving circuit has long sides extending in a direction parallel to the direction of the plurality of rows and short sides extending in a direction intersecting the direction of the plurality of rows,
the driving circuit further comprises a long side bump disposed adjacent to at least one of the long sides of the driving circuit, and
the long side bump has a thickness substantially same as a thickness of the first alignment mark bump.

18. The display device of claim 17, wherein
the driving circuit further comprises edge bumps disposed adjacent to the long sides of the driving circuit and the short sides of the driving circuit, and
each of the edge bumps has a thickness substantially same as a thickness of the first alignment mark bump.

19. A display device comprising:
a display panel comprising a display area and a non-display area adjacent to the display area; and
a driving circuit disposed on the non-display area, the driving circuit comprising:
a driving chip;
a plurality of first bumps extending away from a first surface of the driving chip and disposed in a first row, each of the plurality of first bumps being able to electrically connect the driving circuit with circuit board pads of the non-display area;
a plurality of second bumps extending away from the first surface of the driving chip and disposed in a second row, each of the plurality of second bumps being able to electrically connect the driving circuit with circuit board pads of the non-display area; and
an alignment mark bump extending away from the first surface of the driving chip and disposed at an end of at least one of the first row or the second row.

20. The display device of claim 19, wherein the plurality of first bumps, the plurality of second bumps, and the alignment mark bump have a substantially same thickness.

* * * * *